(12) United States Patent
Song et al.

(10) Patent No.: US 9,673,368 B2
(45) Date of Patent: Jun. 6, 2017

(54) LIGHT EMITTING DEVICE HAVING FIRST AND SECOND ELECTRODES ON ONE SIDE OF A LIGHT EMITTING STRUCTURE

(71) Applicant: LG INNOTEK CO., LTD., Seoul (KR)

(72) Inventors: Hyun Don Song, Seoul (KR); Ki Man Kang, Seoul (KR); Seung Hwan Kim, Seoul (KR); Sung Won David Roh, Seoul (KR); Jin Wook Lee, Seoul (KR); Eun Ju Hong, Seoul (KR); Yee Rang Hong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/150,161

(22) Filed: May 9, 2016

(65) Prior Publication Data

US 2016/0336497 A1    Nov. 17, 2016

(30) Foreign Application Priority Data

May 11, 2015   (KR) .......................... 10-2015-0065483
May 11, 2015   (KR) .......................... 10-2015-0065485

(51) Int. Cl.
*H01L 27/15*     (2006.01)
*H01L 31/12*     (2006.01)
(Continued)

(52) U.S. Cl.
CPC ............. *H01L 33/62* (2013.01); *H01L 33/32* (2013.01); *H01L 33/382* (2013.01); *H01L 33/40* (2013.01);
(Continued)

(58) Field of Classification Search
CPC . H01L 27/32; H01L 27/3202; H01L 27/3204; H01L 27/3209; H01L 27/3225;
(Continued)

(56) References Cited

U.S. PATENT DOCUMENTS

2005/0184300 A1    8/2005   Tazima et al.
2006/0197102 A1*   9/2006   Ogihara ............... G03G 15/326
                                                        257/99
(Continued)

FOREIGN PATENT DOCUMENTS

EP         2234183 A2    9/2010
EP         2858073 A2    4/2015
JP         2006-59933 A  3/2006

*Primary Examiner* — Hoai V Pham
(74) *Attorney, Agent, or Firm* — Birch, Stewart, Kolasch & Birch, LLP

(57) ABSTRACT

A light emitting device having an enhanced surface property and an electrical property is provided. The light emitting device includes a light emitting structure including a first semiconductor layer, an active layer, and a second semiconductor layer, a first electrode disposed on one side of the light emitting structure and electrically connected to the first semiconductor layer, a second electrode disposed on one side of the light emitting structure and electrically connected to the second semiconductor layer, and an ohmic contact including a first layer disposed between the second electrode and the second semiconductor layer and having aluminum (Al), a second layer including at least one $M_xAl_y$ alloy formed by a reaction with Al included in the first layer, and a third layer disposed on the second layer and having gold (Au) is provided.

20 Claims, 16 Drawing Sheets

(51) Int. Cl.
*H01L 33/00* (2010.01)
*H01L 33/62* (2010.01)
*H01L 33/32* (2010.01)
*H01L 33/38* (2010.01)
*H01L 33/40* (2010.01)
*H01L 33/48* (2010.01)
*H01L 33/46* (2010.01)
*H01L 33/60* (2010.01)
*H01L 33/64* (2010.01)

(52) U.S. Cl.
CPC .............. *H01L 33/46* (2013.01); *H01L 33/48* (2013.01); *H01L 33/60* (2013.01); *H01L 33/641* (2013.01); *H01L 33/644* (2013.01); *H01L 33/486* (2013.01); *H01L 33/647* (2013.01); *H01L 2933/0016* (2013.01)

(58) Field of Classification Search
CPC ............. H01L 27/3251; H01L 27/3258; H01L 2227/32; H01L 2924/12044
See application file for complete search history.

(56) References Cited

U.S. PATENT DOCUMENTS

2011/0316039 A1    12/2011   Liu et al.
2014/0231849 A1    8/2014   Song et al.

\* cited by examiner

FIG. 7
(a)
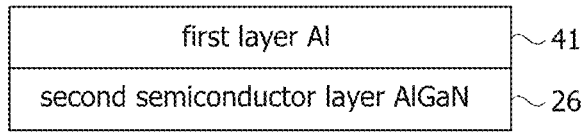
(b)
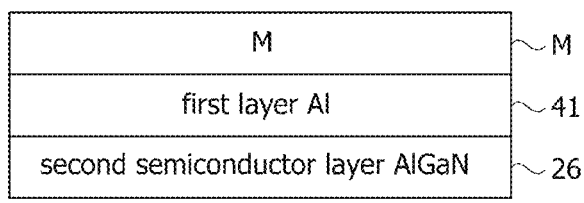
(c)
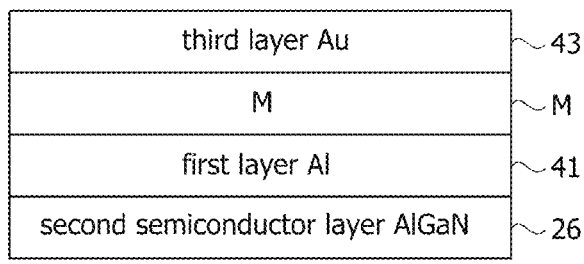
(d)
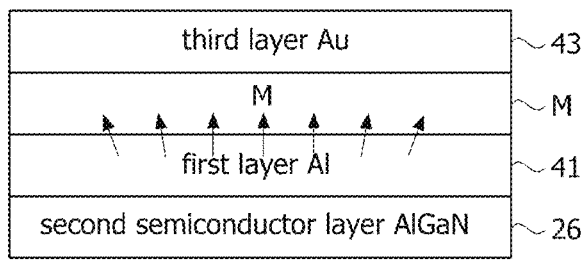
(e)
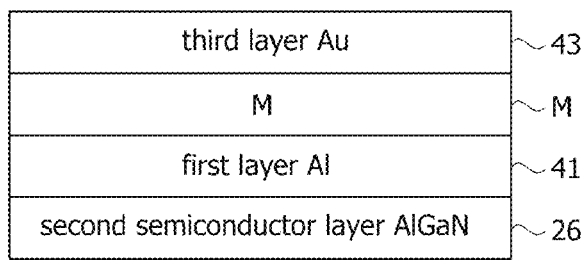

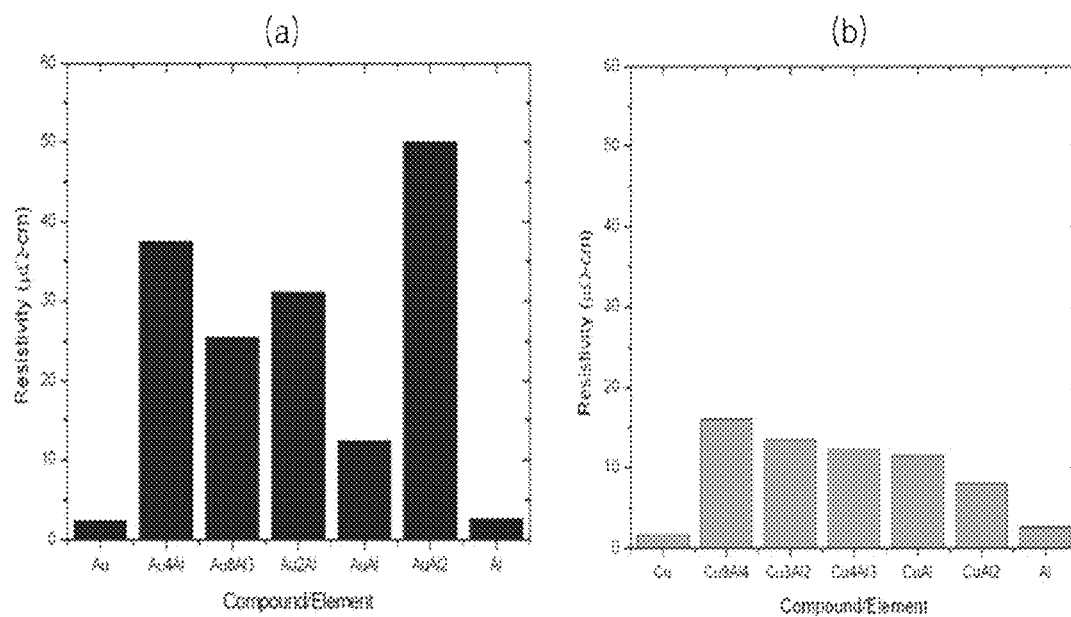

(a)  (b)

(a)  (b)

(a)  (b)

(a)          (b)          (c)

LIGHT EMITTING DEVICE HAVING FIRST AND SECOND ELECTRODES ON ONE SIDE OF A LIGHT EMITTING STRUCTURE

CROSS-REFERENCE TO RELATED APPLICATION

This application claims priority to and the benefit of Korean Patent Application No. 10-2015-0065483, filed on May 11, 2015 and Application No. 10-2015-0065485, filed on May 11, 2015 the disclosure of which is incorporated herein by reference in its entirety.

BACKGROUND

1. Field of the Invention

Embodiments of the present invention relate to a light emitting device and a light emitting device package.

2. Discussion of Related Art

A light emitting diode (LED) is one of light emitting devices which emit light when a current is applied. The LED can emit light with high efficiency, so that an energy saving effect is excellent.

Recently, a problem of brightness of the LED has largely been resolved, and the LED is applied to various devices such as a backlight unit of a liquid crystal display device, an electronic billboard, an indicator, home appliances, etc.

Particularly, a nitride-based semiconductor light emitting device with high efficiency and high output can be implemented by having excellent characteristics in electron affinity, electron mobility, electron saturation velocity, and electric field breakdown voltage, and has received much attention as an eco-friendly device because it does not include harmful materials such as arsenic (As) or mercury (Hg).

SUMMARY OF THE INVENTION

Embodiments provide a light emitting device and a light emitting device package having an enhanced surface property and electrical property.

Embodiments also provide a light emitting device and a light emitting device package in which an electrical property is not degraded even when a heat treatment at high temperature is performed.

Embodiments also provide a light emitting device and a light emitting device package in which an operating voltage property and a device operation property can be enhanced by solving a problem of heat generation.

According to embodiments, a light emitting device includes a light emitting structure including a first semiconductor layer, an active layer, and a second semiconductor layer, a first electrode disposed on one side of the light emitting structure and electrically connected to the first semiconductor layer, a second electrode disposed on one side of the light emitting structure and electrically connected to the second semiconductor layer, and an ohmic contact including a first layer disposed between the second electrode and the second semiconductor layer and having aluminum (Al), a second layer including at least one $M_xAl_y$ alloy formed by a reaction with Al included in the first layer, and a third layer disposed on the second layer and having gold (Au) is provided.

According to embodiments, a light emitting device includes a light emitting structure including a first semiconductor layer, an active layer, and a second semiconductor layer, a first electrode disposed on one side of the light emitting structure and electrically connected to the first semiconductor layer, a second electrode disposed on one side of the light emitting structure and electrically connected to the second semiconductor layer, and a first ohmic contact including a first layer disposed between the second electrode and the second semiconductor layer and having aluminum (Al), a second layer including at least one $M_xAl_y$ alloy formed by a reaction with Al included in the first layer, and a third layer disposed on the second layer and having gold (Au) is provided, wherein, in the light emitting structure, a first region having a nonlinear impedance (non-ohmic) property is disposed on a non-contact region not in contact with a sub-mount through the first electrode.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which:

FIG. 7 shows process diagrams illustrating an ohmic contact according to an embodiment of the present invention;

FIG. 8 shows process diagrams illustrating an ohmic contact according to another embodiment of the present invention;

FIG. 9 shows graphs for comparing an electrical conductivity of a second layer formed according to an embodiment of the present invention with a conventional art;

DETAILED DESCRIPTION OF EXEMPLARY EMBODIMENTS

Figure 1:
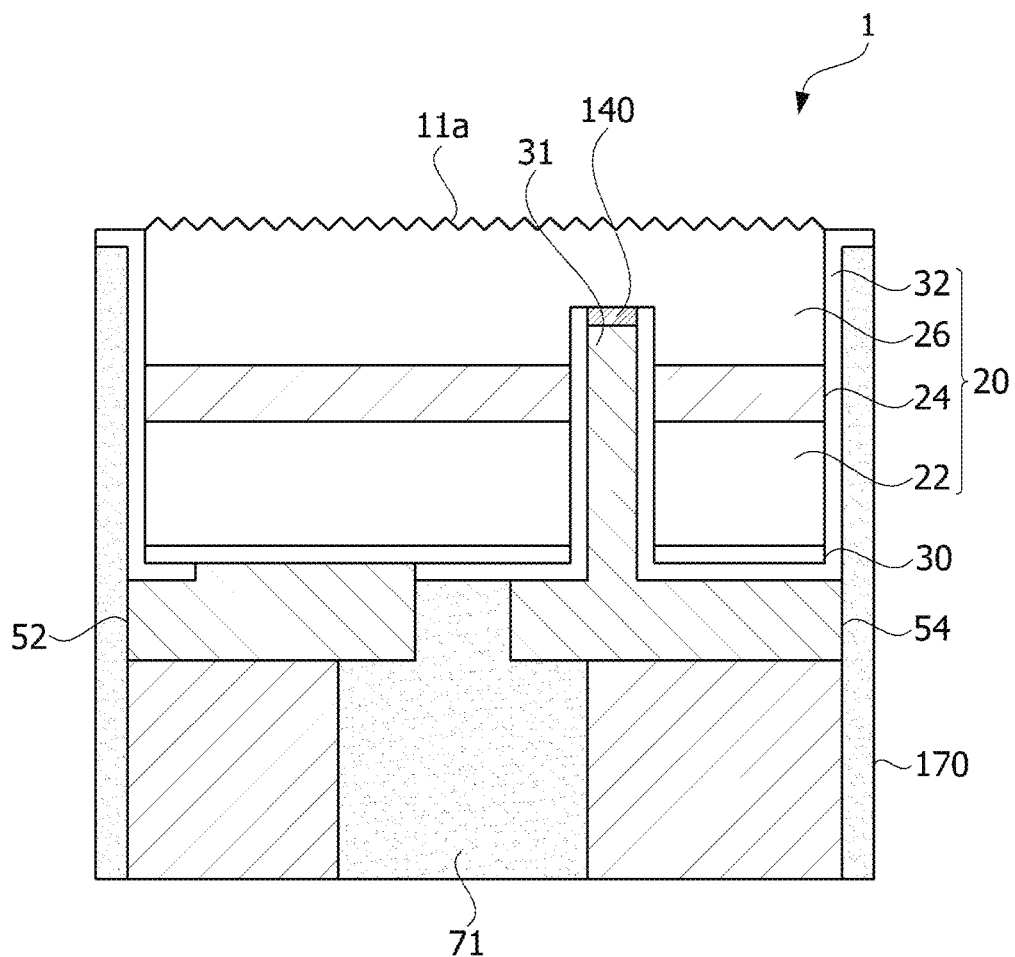
FIG. 1 is a conceptual diagram illustrating a light emitting device according to an embodiment of the present invention.

While the present invention may have various modifications added and a number of embodiments, specific embodiments thereof are shown by way of example in the drawings and will herein be described in detail. It should be understood, however, that there is no intent to limit the inventive concept to the particular forms disclosed, but on the contrary, the inventive concept is to cover all modifications, equivalents, and alternatives falling within the spirit and scope of the inventive concept.

It will be understood that, although the terms "first," "second," etc. may be used herein to describe various components, these components should not be limited by these terms. These terms are only used to distinguish one component from another component. For example, a first component discussed below could be termed a second component, and, likewise, the second component discussed below could be termed the first component without departing from the teachings of the present inventive concept. The term "and/or" includes combinations of listed items or one of the listed items.

It should be understood that when an element is referred to as being "connected" or "coupled" to another element, it can be directly connected to the another element or may be coupled to the other element but intervening elements may also be present. In contrast, when an element is referred to as being "directly connected" or "directly coupled" to another element, it should be understood as there being no intervening elements.

The terminology used herein to describe embodiments of the inventive concept is not intended to limit the scope of the inventive concept. Elements of the inventive concept referred to in the singular may number one or more, unless the context clearly indicates otherwise. It will be further understood that the terms "comprise," "have," etc. when used herein, specify the presence of stated features, numbers, steps, operations, elements, components, and/or groups thereof and do not preclude the presence or addition of one or more other features, numbers, steps, operations, elements, components, and/or groups thereof.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

Hereinafter, example embodiments are described with reference to the attached drawings, the same or corresponding elements will be given the same reference numbers regardless of drawing symbols, and repeated descriptions will be omitted.

FIG. 1 is a conceptual diagram illustrating a light emitting device according to an embodiment of the present invention.

Referring to FIG. 1, the light emitting device 1 according to an embodiment of the present invention may include a light emitting structure 20 including a plurality of semiconductor layers, a first electrode 52 and a second electrode 54 electrically connected to the light emitting structure 20.

The light emitting structure 20 may include a first semiconductor layer 22, an active layer 24, and a second semiconductor layer 26.

The first semiconductor layer 22 may be a compound semiconductor such as a III-V group semiconductor, a II-VI group semiconductor, etc., and the first semiconductor layer 22 may be doped with a first conductive dopant. The first semiconductor layer 22 may satisfy an empirical formula of $Al_xIn_yGa(1-x-y)N$ ($0 \leq x \leq 1$, $0 \leq y \leq 1$, $0 \leq x+y \leq 1$). For example, the first semiconductor layer 22 may include at least one of AlGaN, InAlGaN, AlGaAs, GaP, GaAs, GaAsP, and AlGaInP.

When the first semiconductor layer 22 is a P-type semiconductor layer, the first conductive dopant may be a P-type dopant such as Mg, Zn, Ca, Sr, Ba, etc. The first semiconductor layer 22 may be formed as a single layer or multiple layers, but it is not limited thereto.

In the case of an ultraviolet (UV), a deep UV, or a non-polarization light emitting device, the first semiconductor layer 22 may include at least one of InAlGaN and AlGaN. When the first semiconductor layer 22 is a P-type semiconductor layer, the first semiconductor layer 22 may include an AlGaN gradient in which a concentration of aluminum has a gradient to decrease a lattice difference, and may have a thickness of 10 nm to 100 nm.

The active layer 24 disposed between the first semiconductor layer 22 and the second semiconductor layer 26 may include one of a single-well structure, a multiple-well structure, a single quantum-well structure, a multiple quantum-well (MQW) structure, a quantum-dot or quantum-wire structure, etc.

The active layer 24 may be formed with a well layer and a barrier layer by using III-V group compound semiconductor materials, for example, at least one pair structure of InGaN/GaN, InGaN/InGaN, GaN/AlGaN, InAlGaN/GaN, GaAs(InGaAs)/AlGaAs, and GaP(InGaP)/AlGaP, but it is not limited thereto. The well layer may be formed of a material having an energy band gap smaller than the energy band gap of the barrier layer.

The second semiconductor layer 26 may be a compound semiconductor such as a III-V group semiconductor, a II-VI group semiconductor, etc., and the second semiconductor layer 26 may be doped with a second conductive dopant. The second semiconductor layer 26 may satisfy an empirical formula of $Al_xIn_yGa(1-x-y)N$ ($0 \leq x \leq 1$, $0 \leq y \leq 1$, $0 \leq x+y \leq 1$). For example, the second semiconductor layer 26 may include at least one of AlGaN, InAlGaN, AlGaAs, GaP, GaAs, GaAsP, and AlGaInP.

When the second semiconductor layer 26 is an N-type semiconductor layer, the second conductive dopant may be an N-type dopant such as Si, Ge, Sn, Se, Te, etc. The second semiconductor layer 26 may be formed as a single layer or multiple layers, but it is not limited thereto.

In the case of an ultraviolet (UV), a deep UV, or a non-polarization light emitting device, the second semiconductor layer 26 may include at least one of InAlGaN and AlGaN. When the second semiconductor layer 26 includes AlGaN, a content of Al may be 50%. When the second semiconductor layer 26 is an N-type semiconductor layer, the second semiconductor layer 26 may include $Al_{0.5}GaN$, and may have a thickness of 0.6 μm to 2.6 μm, for example, 1.6 μm.

According to the embodiment, a top surface of the light emitting structure 20 may have a concavo-convex portion 11a. However, it is not limited thereto. For example, the top surface of the light emitting structure 20 may also be a flat surface.

The first electrode 52 and the second electrode 54 may be disposed on one side of the light emitting structure 20. Here, the one side may be a side opposite a main light emitting surface of the light emitting structure 20. The light emitting device 1 according to the embodiment of the present invention may be a flip chip or thin-film flip chip (TFFC) in which the first electrode 52 and the second electrode 54 are disposed to be coplanar.

The light emitting device according to the embodiment of the present invention is not limited to the flip chip form, and may also be applied to a lateral chip form and a vertical chip form. In a lateral chip structure or a vertical chip structure, a configuration relation among the light emitting structure 20, the first electrode 52 and the second electrode 54 may be different from that in the flip chip, and an ohmic contact may be disposed between the second semiconductor layer 26 and the second electrode 54.

The first electrode 52 may be electrically connected to the first semiconductor layer 22 of the light emitting structure 20, and the second electrode 54 may be electrically connected to the second semiconductor layer 26.

The first electrode 52 may be electrically connected to the first semiconductor layer 22 through an ohmic contact 30, and the second electrode 54 may be electrically connected to the second semiconductor layer 26 through a contact hole. An extended portion 31 of the second electrode 54 filling the contact hole may be electrically insulated from the active layer 24 and the first semiconductor layer 22 by an interlayer 32.

The first electrode 52 and the second electrode 54 may be disposed adjacent to each other at one side of the light emitting structure 20. Here, the first electrode 52 and the second electrode 54 may be separated by a specific distance for electrical insulation. Thicknesses of the first electrode 52 and the second electrode 54 may be the same, but are not limited thereto.

A support layer 170 may be formed to surround a side surface of at least one of the light emitting structure 20, the first electrode 52, and the second electrode 54. The support layer 170 may include an insulation portion 71 disposed between the first electrode 52 and the second electrode 54. The support layer 170 may be a cured polymer resin. The types of the polymer resin are not limited.

An ohmic contact 140 may be disposed between the second electrode 54 and the second semiconductor layer 26. One surface of the ohmic contact 140 may be electrically connected to the second electrode 54, and the other surface may be electrically connected to the second semiconductor layer 26. A side surface of the ohmic contact 140 may be surrounded by the interlayer 32, but it is not limited thereto.

Figure 2:
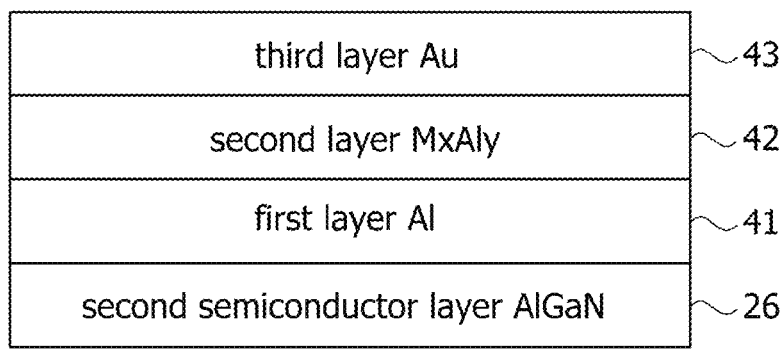
FIG. 2 is a cross-sectional view illustrating an ohmic contact according to an embodiment of the present invention.

FIG. 2 is a cross-sectional view illustrating an ohmic contact according to an embodiment of the present invention.

Referring to FIG. 2, the ohmic contact according to the embodiment of the present invention may be formed by sequentially stacking a first layer 41, a second layer 42, and a third layer 43 on the second semiconductor layer 26.

The first layer 41 may be formed of a material such as aluminum (Al) or an alloy including Al. A thickness of the first layer 41 may be, for example, in the range of 50 nm to 500 nm, but it is not limited thereto, and may have various thicknesses based on a thickness of a metal M forming the second layer 42.

The second layer 42 may include at least one $M_xAl_y$ alloy formed by a reaction with Al included in the first layer 41. A thickness of the second layer 42 may be, for example, in the range of 5 nm to 500 nm, but it is not limited thereto, and may have various thicknesses based on a thickness of the first layer 41.

M included in the second layer 42 may be a metal having a melting point higher than that of Al. M reacts with Al at a heat treatment temperature of 700° C. or more and forms the second layer 42. When a heat treatment process is performed at a temperature of a melting point or more, Al included in the first layer 41 diffuses and forms a compound with M to form the second layer 42.

M may include one metal selected from copper (Cu), palladium (Pd), and silver (Ag). However, it is not limited thereto, and M may be any metal having a melting point higher than that of Al, and an electrical conductivity of the alloy formed by a chemical reaction with Al may be greater than that of an Al—Au alloy.

Further, M may be a metal in which the electrical conductivity of the alloy formed by a chemical reaction with Al may be greater than that of an Al—Au alloy, and a variation of an electrical resistance is 5Ω or less.

The third layer 43 is disposed on the second layer 42, and may be formed of a material such as gold (Au) or an alloy including Au. A thickness of the third layer 43 may be, for example, in the range of 20 nm to 500 nm, but it is not necessarily limited thereto.

Figure 3:
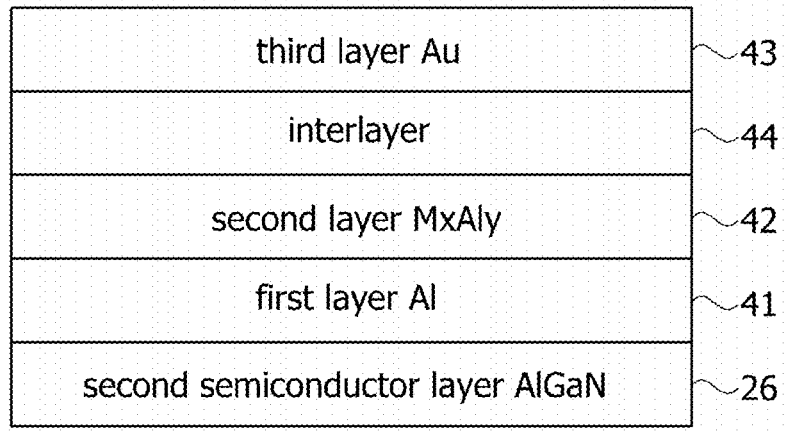
FIG. 3 is a cross-sectional view illustrating an ohmic contact according to another embodiment of the present invention.

FIG. 3 is a cross-sectional view illustrating an ohmic contact according to another embodiment of the present invention.

Referring to FIG. 3, the ohmic contact according to another embodiment of the present invention may be formed by sequentially stacking a first layer 41, a second layer 42, an interlayer 44, and a third layer 43 on the second semiconductor layer 26.

The ohmic contact according to the embodiment of FIG. 3 is a configuration in which the interlayer 44 is added to the embodiment of FIG. 2, and repeated descriptions will be omitted.

The interlayer 44 may be disposed on the second layer 42 and may prevent an oxidation phenomenon of the second layer 42. The interlayer 44 may include, for example, at least one metal or alloy selected from chromium (Cr), nickel (Ni), titanium (Ti), and gold (Au). In the interlayer 44, a metal or an alloy of the metal having low reactivity with oxygen is disposed on the second layer 42 so that the combining of the second layer 42 and oxygen may be prevented.

Figure 4:
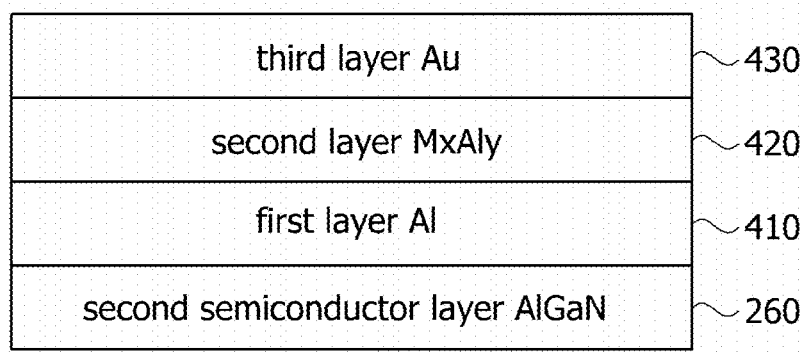
FIG. 4 is a cross-sectional view illustrating an ohmic contact according to still another embodiment of the present invention.

FIG. 4 is a cross-sectional view illustrating an ohmic contact according to still another embodiment of the present invention.

Referring to FIG. 4, the ohmic contact according to still another embodiment of the present invention may be formed by sequentially stacking a first layer 410, a second layer 420, and a third layer 430 on a second semiconductor layer 260.

The first layer 410 may be formed of a material such as aluminum (Al) or an alloy including Al. A thickness of the first layer 410 may be, for example, in the range of 50 nm to 500 nm, but it is not limited thereto, and may have various thicknesses based on a thickness of a metal Cu forming the second layer 420.

The second layer 420 may include at least one $Cu_xAl_y$ alloy ($1 \leq x \leq 9$, $1 \leq y \leq 4$) formed by a reaction with Al included in the first layer 410. A thickness of the second layer 420 may be, for example, in the range of 5 nm to 500 nm, but it is not limited thereto, and may have various thicknesses based on a thickness of the first layer 410.

Cu reacts with Al at a heat treatment temperature of 700° C. or more and forms the second layer 420. When a heat treatment process is performed at a temperature of a melting point or more, Al included in the first layer 410 diffuses and forms a compound with Cu to form the second layer 420.

In the $Cu_xAl_y$ alloy forming the second layer 420, y may have a value equal to or greater than x. The second layer 420 may include, for example, at least one alloy selected from $CuAl$, $CuAl_2$, $Cu_4Al_3$, $Cu_3Al_2$, and $Cu_9Al_4$.

However, it is not limited thereto, and the second layer 420 may have an electrical resistance of 20Ω or less, and may include all of the $Cu_xAl_y$ alloys in which a variation of the electrical resistance is 5Ω or less and other impurities.

The third layer 430 is disposed on the second layer 420, and may be formed of a material such as gold (Au) or an alloy including Au. A thickness of the third layer 430 may be, for example, in the range of 20 nm to 500 nm, but it is not necessarily limited thereto.

Figure 5:
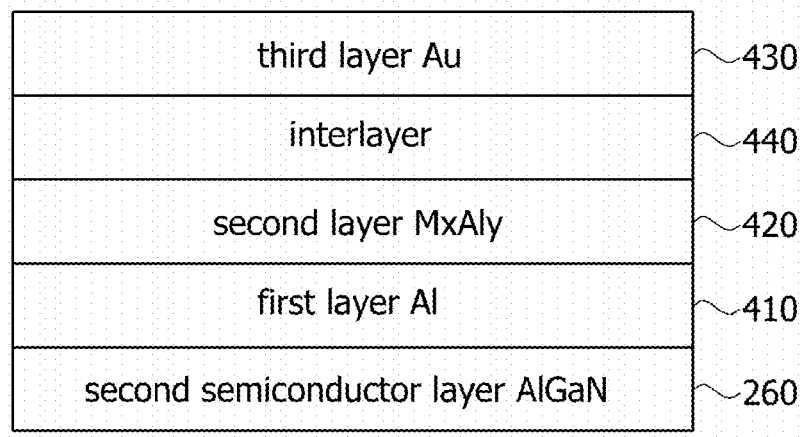
FIG. 5 is a cross-sectional view illustrating an ohmic contact according to yet another embodiment of the present invention.

FIG. 5 is a cross-sectional view illustrating an ohmic contact according to yet another embodiment of the present invention.

Referring to FIG. 5, the ohmic contact according to yet another embodiment of the present invention may be formed by sequentially stacking a first layer 410, a second layer 420, an interlayer 440, and a third layer 430 on the second semiconductor layer 260.

The ohmic contact according to the embodiment of FIG. 5 is a configuration in which the interlayer 440 is added to the embodiment of FIG. 4, and repeated descriptions will be omitted.

The interlayer 440 may be disposed on the second layer 420 and may prevent an oxidation phenomenon of the second layer 420. The interlayer 440 may include, for example, at least one metal or alloy selected from chromium (Cr), nickel (Ni), titanium (Ti), and gold (Au). In the interlayer 440, a metal or an alloy of the metal having a low activity with oxygen is disposed on the second layer 420 so that the combining of the second layer 420 and oxygen may be prevented.

Figure 6:
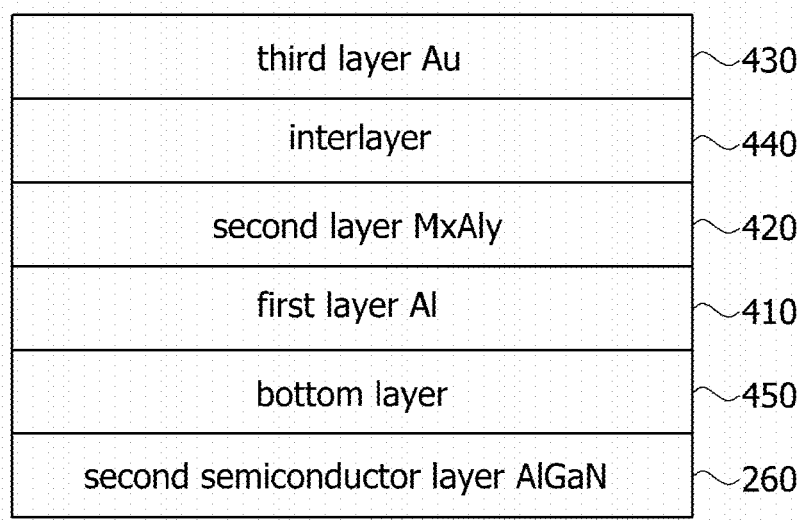
FIG. 6 is a cross-sectional view illustrating an ohmic contact according to yet another embodiment of the present invention.

FIG. 6 is a cross-sectional view illustrating an ohmic contact according to yet another embodiment of the present invention.

Referring to FIG. 6, the ohmic contact according to yet another embodiment of the present invention may be formed by sequentially stacking a bottom layer 450, a first layer 410, a second layer 420, an interlayer 440, and a third layer 430 on the second semiconductor layer 260.

The ohmic contact according to the embodiment of FIG. 6 is a configuration in which the bottom layer 450 is added to the embodiment of FIG. 5, and repeated descriptions will be omitted.

The bottom layer 450 may be disposed between the first layer 410 and the second semiconductor layer 260, and may prevent Al included in the first layer 410 from diffusing into the second semiconductor layer 260. The bottom layer 450 may include, for example, at least one metal of chromium (Cr), titanium (Ti), niobium (Nb), vanadium (V), tungsten (W), tantalum (Ta), rhenium (Re), molybdenum (Mo), manganese (Mn), platinum (Pt), palladium (Pd), rhodium (Rh), yttrium (Y), and zirconium (Zr), and a plurality of layers rather than a single layer may be disposed between the first layer 410 and the second semiconductor layer 260.

FIG. 7 shows process diagrams illustrating an ohmic contact according to an embodiment of the present invention.

Referring to FIG. 7, the ohmic contact according to the embodiment of the present invention may be formed by sequentially stacking a first layer 41, a metal layer M, and a third layer 43 on the second semiconductor layer 26, and performing a heat treatment. Here, the first layer 41, the metal layer M, and the third layer 43 may be deposited by a sputtering method, a vacuum evaporation method, a metal plating method, an epitaxial method, etc., but it is not necessarily limited thereto.

The heat treatment process may be performed at a high temperature equal to or higher than a melting point of Al, for example, at a temperature equal to or higher than 700° C., but it is not necessarily limited thereto, and the temperature may be determined considering a relation between the temperature and a contact resistance.

By the heat treatment process, Al included in the first layer 41 diffuses into the layer M, and the second layer 42 including at least one $M_xAl_y$ alloy is formed.

FIG. 8 shows process diagrams illustrating an ohmic contact according to another embodiment of the present invention.

Referring to FIG. 8, in a state in which the interlayer 440 is additionally stacked on the layer M, the heat treatment process is performed. The interlayer 440 may prevent a fog phenomenon of the second layer 420 by blocking the combining of the $M_xAl_y$ alloy and oxygen in the heat treatment process.

FIG. 9 shows graphs for comparing an electrical conductivity of a second layer formed according to an embodiment of the present invention with a conventional art.

Referring to FIG. 9(A), in the ohmic contact according to the conventional art, an Al—Au alloy is generated in the heat treatment, and in the case of the Al—Au alloy, a maximum electrical resistance is 50Ω, and an electrical resistance variation between alloys is 40Ω, and therefore the electrical conductivity of the ohmic contact may decrease.

Referring to FIG. 9(B), in the case of the ohmic contact according to an embodiment of the present invention, a Cu layer is stacked on the first layer 410 and the heat treatment is performed to form the second layer 420 including a $Cu_xAl_y$ alloy. The second layer 420 may include at least one alloy of $CuAl$, $CuAl_2$, $Cu_4Al_3$, $Cu_3Al_2$, and $Cu_9Al_4$, and it is shown that the electrical resistance of each alloy is 20Ω or less, and the electrical resistance variation between alloys is 5Ω or less. In the case of the ohmic contact according to the embodiment of the present invention, the electrical resistivity of the ohmic contact is not significantly different from the electrical resistivity of Al or Au, and therefore a decrease in the electrical conductivity of the ohmic contact may be prevented.

Figure 10:
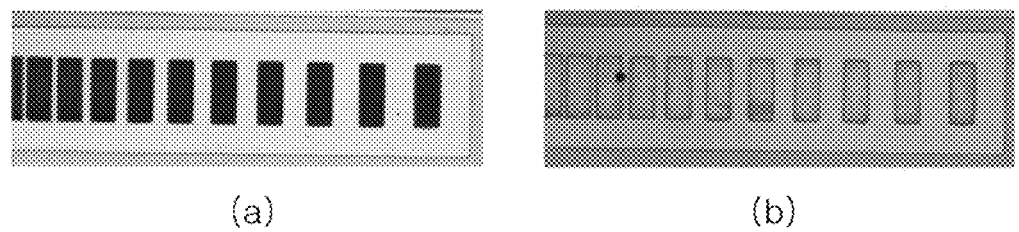
FIGS. 10 and 11 are diagrams illustrating surfaces of ohmic contacts formed according to a conventional art and an embodiment of the present invention.
Figure 11:
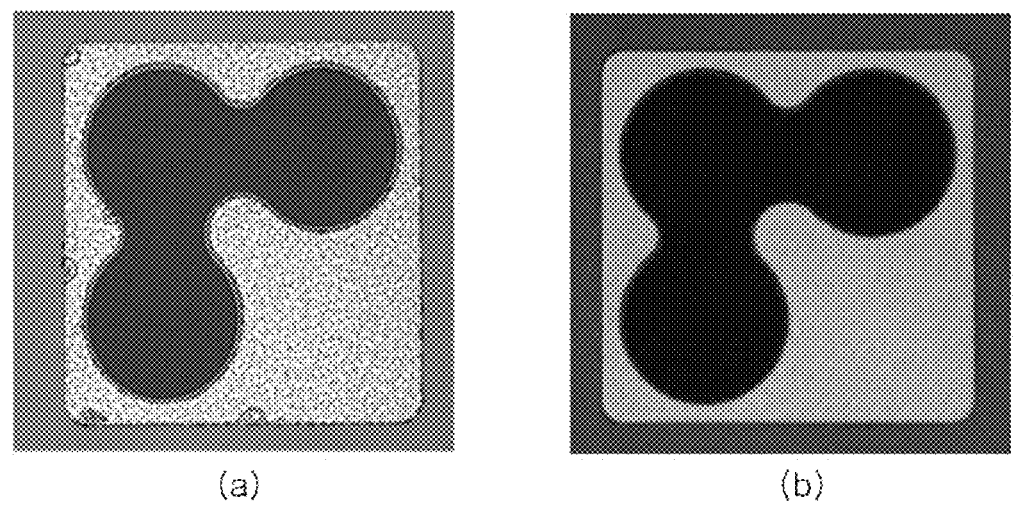

FIGS. 10 and 11 are diagrams illustrating surfaces of ohmic contacts formed according to a conventional art and an embodiment of the present invention.

Referring to FIG. 10(A), in the surface of the ohmic contact according to the conventional art, it can be seen that a surface portion has a different color due to an unbalanced distribution of an Al—Au alloy. This phenomenon is generated due to an influence of the $AuAl_2$ alloy having an electrical resistance about 30 times higher than Au or Al.

Referring to FIG. 10(B), in the ohmic contact according to the embodiment of the present invention, it can be seen that a color change of a surface portion does not occur by forming an alloy which has a small variation of electrical resistance in the heat treatment at high temperature.

Referring to FIG. 11(A), in the surface of the ohmic contact according to the conventional art, it can be seen that a surface state is uneven due to diffusion of Al in the heat treatment at high temperature, whereas, referring to FIG. 11(B), in the surface of the ohmic contact according to the embodiment of the present invention, it can be seen that a surface is formed even by forming the second layer to accommodate the diffusion of Al in the heat treatment at high temperature.

Figure 12:
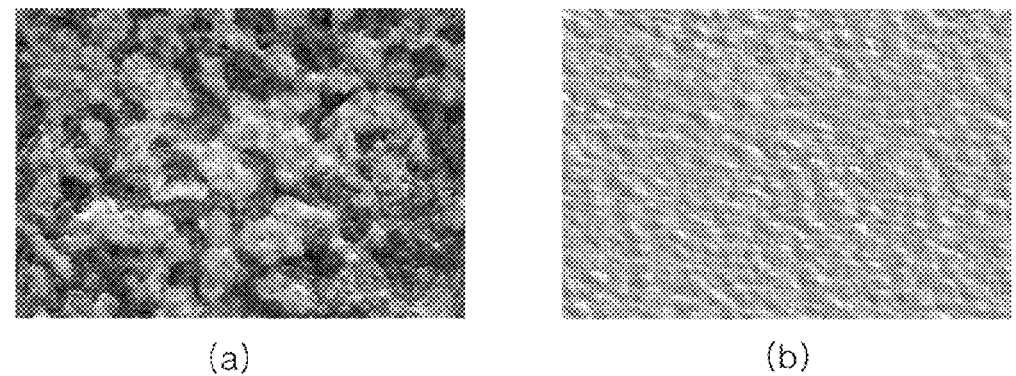
FIG. 12 shows enlarged views of the surfaces of the ohmic contacts formed according to the conventional art and the embodiment of the present invention.

FIG. 12 shows enlarged views of the surfaces of the ohmic contacts formed according to the conventional art and the embodiment of the present invention.

Referring to FIG. 12(A), it can be seen that the surface of the ohmic contact according to the conventional art is formed uneven. Referring to FIG. 12(B), it can be seen that the surface of the ohmic contact according to the embodiment of the present invention is formed even by forming the second layer to accommodate the diffusion of Al in the heat treatment at high temperature.

Figure 13:
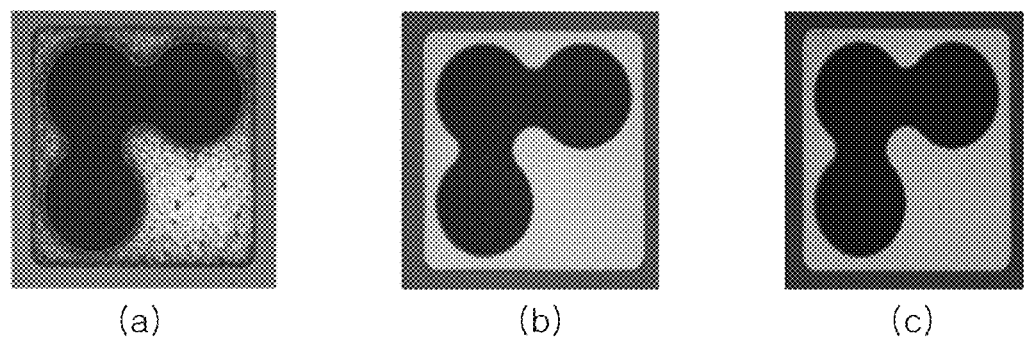
FIG. 13 shows diagrams for describing a function of an interlayer of an ohmic contact according to an embodiment of the present invention.

FIG. 13 shows diagrams for describing a function of an interlayer of an ohmic contact according to an embodiment of the present invention.

Referring to FIG. 13(A), in the case of performing the heat treatment without the interlayer, it can be seen that the fog phenomenon is generated by the combining of the second layer 420 and oxygen. FIG. 13(B) represents a surface of an ohmic contact in which the heat treatment is performed in a condition in which 5% oxygen is injected, and (c) of FIG. 13 represents a surface of an ohmic contact in which the heat treatment is performed in a condition in which 20% oxygen is injected. In FIGS. 13(B) and 13(C), the fog phenomenon may be prevented by blocking the combining of the second layer 420 and oxygen using the interlayer 440.

Figure 14:
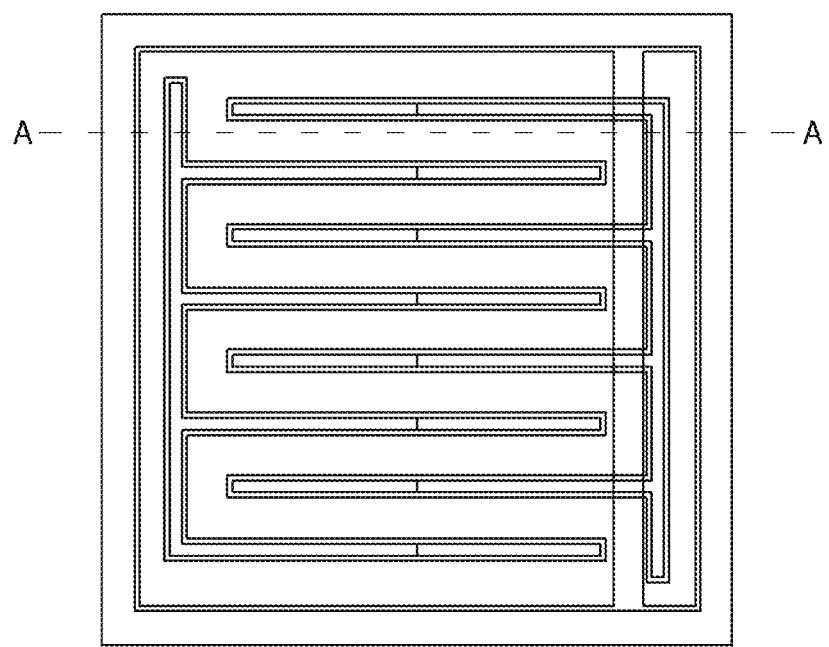
FIG. 14 is a plan view illustrating a light emitting device according to another embodiment of the present invention.
Figure 15:
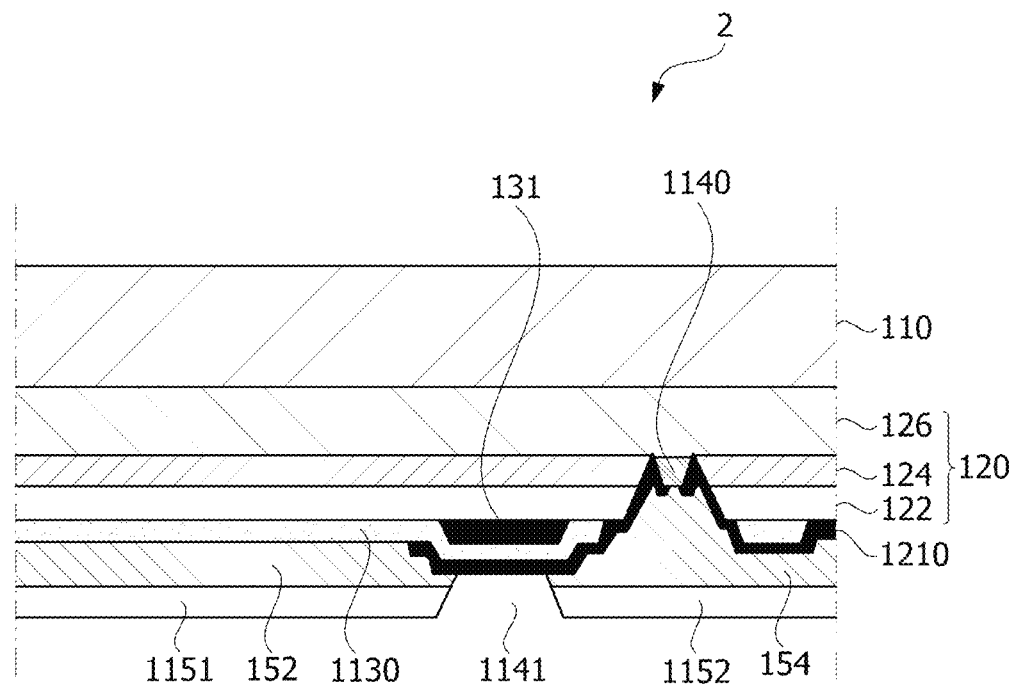
FIG. 15 is a cross-sectional view taken along line A-A' of the light emitting device of FIG. 14.

FIG. 14 is a plan view illustrating a light emitting device according to another embodiment of the present invention, and FIG. 15 is a cross-sectional view taken along line A-A' of the light emitting device of FIG. 14. Referring to FIGS. 14 and 15, the light emitting device 2 according to another embodiment of the present invention may include a light emitting structure 120, electrode layers 152 and 154, and bumps 1151 and 1152.

The light emitting structure 120 may be disposed on a substrate 110. The light emitting structure 120 may include a first semiconductor layer 122, an active layer 124, and a second semiconductor layer 126.

The first semiconductor layer 122 may be a compound semiconductor such as a III-V group semiconductor, a II-VI group semiconductor, etc., and the first semiconductor layer 122 may be doped with a first conductive dopant. The first semiconductor layer 22 may satisfy an empirical formula of $Al_xIn_yGa(1-x-y)N$ ($0 \leq x \leq 1$, $0 \leq y \leq 1$, $0 \leq x+y \leq 1$). For example, the first semiconductor layer 122 may include at least one of AlGaN, InAlGaN, AlGaAs, GaP, GaAs, GaAsP, and AlGaInP.

When the first semiconductor layer 122 is a P-type semiconductor layer, the first conductive dopant may be a P-type dopant such as Mg, Zn, Ca, Sr, Ba, etc. The first semiconductor layer 122 may be formed as a single layer or multiple layers, but it is not limited thereto.

The active layer 124 disposed between the first semiconductor layer 122 and the second semiconductor layer 126 may include one of a single-well structure, a multiple-well structure, a single quantum-well structure, a multiple quantum-well (MQW) structure, a quantum-dot or quantum-wire structure, etc.

The active layer 124 may be formed with a well layer and a barrier layer by using III-V group compound semiconductor materials, for example, at least one pair structure of InGaN/GaN, InGaN/InGaN, GaN/AlGaN, InAlGaN/GaN, GaAs(InGaAs)/AlGaAs, and GaP(InGaP)/AlGaP, but it is not limited thereto. The well layer may be formed of a material having an energy band gap smaller than the energy band gap of the barrier layer.

The second semiconductor layer 126 may be a compound semiconductor such as a III-V group semiconductor, a II-VI group semiconductor, etc., and the second semiconductor layer 126 may be doped with a second conductive dopant. The second semiconductor layer 126 may satisfy an empirical formula of $Al_xIn_yGa(1-x-y)N$ ($0 \leq x \leq 1$, $0 \leq y \leq 1$, $0 \leq x+y \leq 1$). For example, the second semiconductor layer 126 may include at least one of AlGaN, InAlGaN, AlGaAs, GaP, GaAs, GaAsP, and AlGaInP.

When the second semiconductor layer 126 is an N-type semiconductor layer, the second conductive dopant may be an N-type dopant such as Si, Ge, Sn, Se, Te, etc. The second semiconductor layer 126 may be formed as a single layer or multiple layers, but it is not limited thereto.

A first ohmic contact 1140 may be disposed between the second electrode 154 and the second semiconductor layer 126. One surface of the ohmic contact 1140 may be electrically connected to the second electrode 154, and the other surface may be electrically connected to the second semiconductor layer 126. A side surface of the ohmic contact 1140 may be surrounded by an interlayer 1210, but it is not limited thereto.

The first ohmic contact 1140 may include a first layer including aluminum (Al), a second layer including at least one $M_xAl_y$ alloy formed by a reaction with Al included in the first layer, and a third layer disposed on the second layer and including gold (Au). In another embodiment of the present invention, as the first ohmic contact 1140, the ohmic contacts according to the embodiments described in FIGS. 1 to 13 may be used.

In the light emitting structure 120, a first region 131 having a nonlinear impedance (non-ohmic) property may be disposed on a non-contact region 1141 not in contact with a sub-mount through the electrodes 152 and 154. In the embodiment of the present invention, the non-contact region 1141 may include a separate region between the first bump 1151 and the second bump 1152.

The first region 131 may be disposed on the same vertical line with the non-contact region 1141, and may be disposed on a contact surface in which the first semiconductor layer 122 is in contact with the first electrode 152. The first region 131 may be disposed, for example, on a second ohmic contact 1130 which is disposed on the same vertical line with the non-contact region 1141. The first region 131 may be disposed, for example, over a part or all of the second ohmic contact 1130 which is disposed on the same vertical line with the non-contact region 1141.

A length of the first region 131 may be equal to or smaller than that of the non-contact region 1141. When the first region 131 is disposed so that the length of the first region 131 is greater than the length of the non-contact region 1141, a portion which contributes to light emission in the light emitting structure 120 and the second ohmic contact 1130 may be reduced, and therefore light emission efficiency is lowered. Therefore, the length of the first region 131 may be disposed smaller than that of the non-contact region 1141 so that heat generation is prevented and the light emission efficiency is also maximized.

The first region 131 may include at least one of an oxide, a nitride and a metal, and may include a material having high transmissivity and high reflectivity with respect to a wavelength of light being emitted from the active layer 124.

The first region 131 is a region having a non-linear impedance characteristic, and does not contribute to light emission by the non-implementation of an ohmic contact between the first semiconductor layer 122 and the first electrode 152. That is, when a light emitting device operates, the first region 131 not having an ohmic characteristic becomes a region in which heat is not generated, and an operation property of the light emitting device may be enhanced and a lifetime of the light emitting device may be extended.

The electrodes 152 and 154 are in electrical contact with the light emitting structure 120. The first electrode 152 and the second electrode 154 may be disposed on one side of the light emitting structure 120, and here, the one side may be a side opposite a main light emitting surface of the light emitting structure 120. A light emitting device 1300 according to another embodiment of the present invention may be a flip chip or thin-film flip chip (TFFC) in which the first electrode 152 and the second electrode 154 are disposed to be coplanar.

The light emitting device according to another embodiment of the present invention is not limited to the flip chip form, and may also be applied to a lateral chip form and a vertical chip form. In a lateral chip structure and a vertical chip structure, a configuration relation among the light emitting structure, the first electrode and the second electrode may be different from that in the flip chip.

The first electrode 152 may be electrically connected to the first semiconductor layer 122 of the light emitting structure 120, and the second electrode 154 may be electrically connected to the second semiconductor layer 126.

Alternatively, the first electrode 152 may be electrically connected to the first semiconductor layer 122 through a reflective layer (not shown), and the second electrode 154 may be electrically connected to the second semiconductor layer 126 through a contact hole. An extended portion 1140 of the second electrode 154 filling the contact hole may be electrically insulated from the active layer 124 and the first semiconductor layer 122 by the interlayer 1210.

The first electrode 152 and the second electrode 154 may be disposed adjacent to each other at one side of the light emitting structure 120. Here, the first electrode 152 and the second electrode 154 may be separated by a specific distance for electrical insulation. Thicknesses of the first electrode 152 and the second electrode 154 may be the same, but are not necessarily limited thereto.

The second ohmic contact 1130 may be disposed between the first electrode 152 and the light emitting structure 120. One surface of the second ohmic contact 1130 may be electrically connected to the first electrode 152, and the other surface may be electrically connected to the first semiconductor layer 122. A side surface of the second ohmic contact 1130 may be surrounded by the interlayer 1210, but it is not necessarily limited thereto.

The first bump 1151 and the second bump 1152 may be mutually separated by a predetermined distance and respectively disposed on the first electrode 152 and the second electrode 154 so that the first bump 1151 and the second bump 1152 come in contact with an electrode of the submount.

The first bump 1151 is electrically connected to the first electrode 152, and the second bump 1152 is electrically connected to the second electrode 154. The first bump 1151 and the second bump 1152 may respectively be in contact with the first electrode 152 and the second electrode 154 through a region in which the interlayer 1210 is not disposed.

The thicknesses of the first bump 1151 and the second bump 1152 may be greater than the thicknesses of the first electrode 152 and the second electrode 154, but are not necessarily limited thereto. The thicknesses of the first bump 1151 and the second bump 1152 may be different based on a mutual separation distance. The first bump 1151 and the second bump 1152 may have thicknesses which may expose the first bump 1151 and the second bump 1152 to the outside to be connected to an external power supply.

Figure 16:
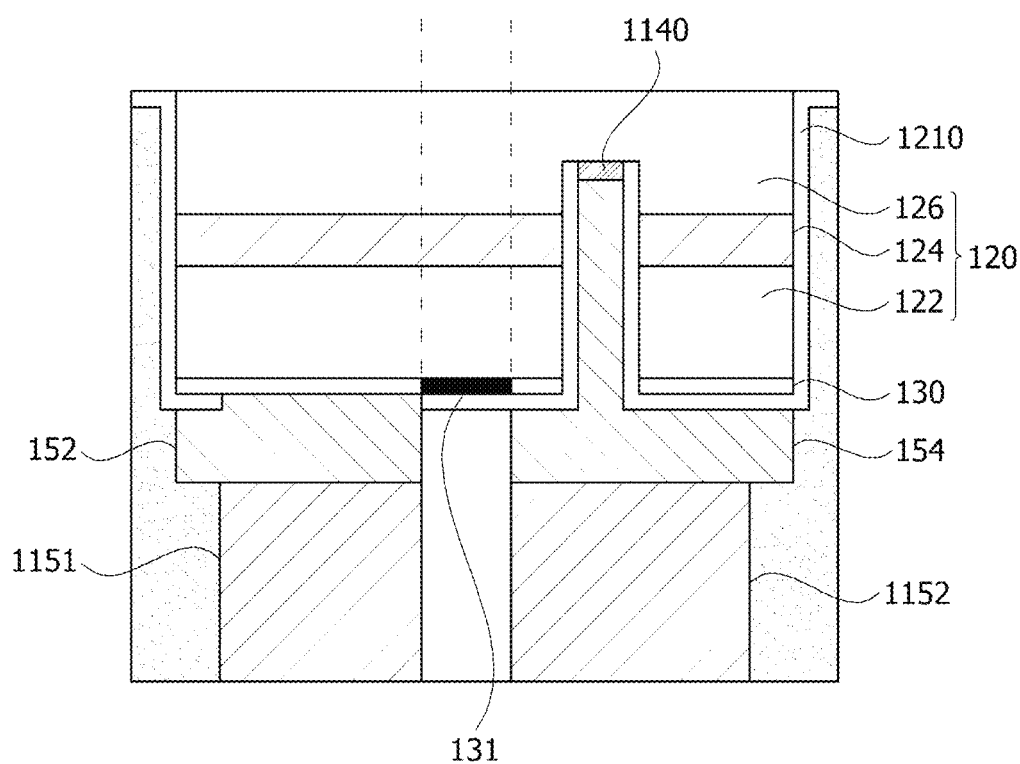
FIG. 16 is a cross-sectional view illustrating a light emitting device according to another embodiment of the present invention.

FIG. 16 is a cross-sectional view illustrating a light emitting device according to another embodiment of the present invention. Referring to FIG. 16, the light emitting device according to another embodiment of the present invention may include a substrate 110, a light emitting structure 120, a first electrode 152, a second electrode 154, a first bump 1151, and a second bump 1152. In the embodiment, descriptions overlapping with FIGS. 14 and 15 will be omitted.

In FIG. 16, the first bump 1151 and the second bump 1152 may be mutually separated by a predetermined distance and respectively disposed on the first electrode 152 and the second electrode 154. The lengths of the first bump 1151 and the second bump 1152 are the same as the lengths of the first electrode 152 and the second electrode 154 with a predetermined tolerance, and the non-contact region 1141 is disposed between the first bump 1151 and the second bump 1152. At the second ohmic contact 130 which is on the same vertical line with the non-contact region 1141, the first region 131 having a non-linear impedance characteristic is disposed. The first region 131 may be disposed in an entire region of the second ohmic contact 130 on the same vertical line with the non-contact region 1141. In FIG. 16, a side surface of each of the first electrode 152, the second electrode 154, the first bump 1151, the second bump 1152, and the first region 131 is shown with a vertical surface, but it is not necessarily limited thereto.

Figure 17:
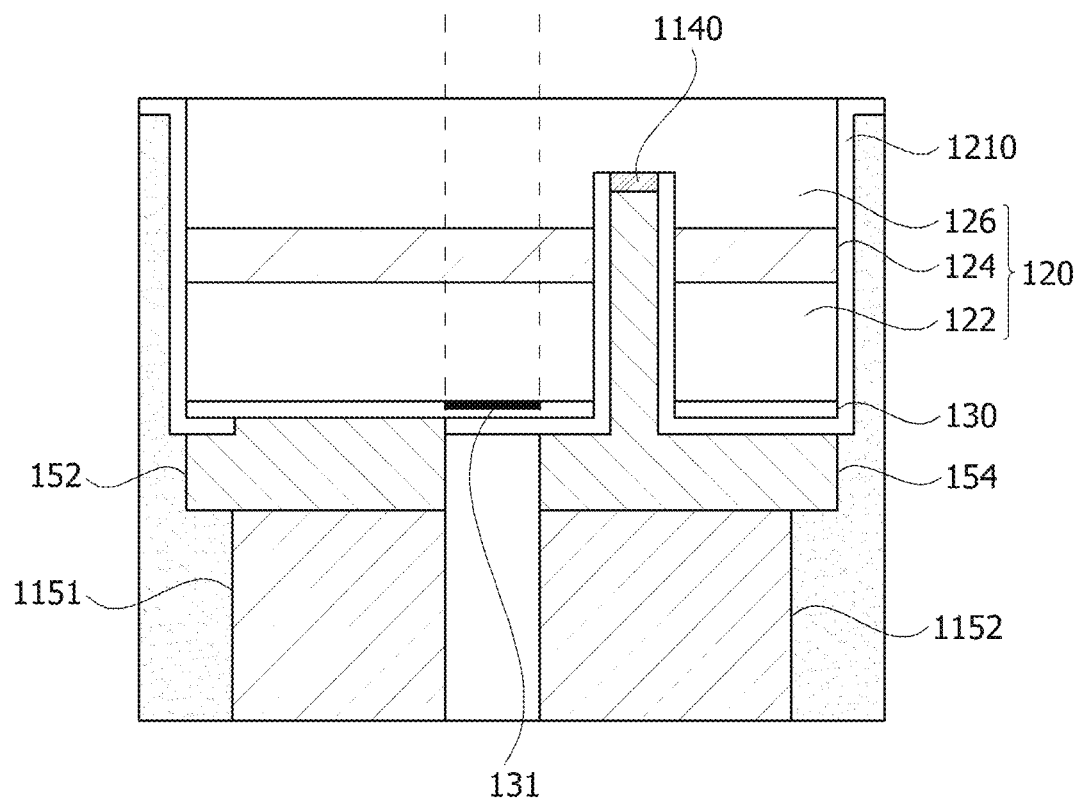
FIG. 17 is a cross-sectional view illustrating a light emitting device according to still another embodiment of the present invention.

FIG. 17 is a cross-sectional view illustrating a light emitting device according to still another embodiment of the present invention. Referring to FIG. 17, the light emitting device according to still another embodiment of the present invention may include a substrate 110, a light emitting structure 120, a first electrode 152, a second electrode 154, a first bump 1151, and a second bump 1152. In the embodiment, descriptions overlapping with FIGS. 14 and 15 will be omitted.

In FIG. 17, the first bump 1151 and the second bump 1152 may be mutually separated by a predetermined distance and respectively disposed on the first electrode 152 and the second electrode 154. The lengths of the first bump 1151 and the second bump 1152 are the same as the lengths of the first electrode 152 and the second electrode 154 with a predetermined tolerance, and the non-contact region 1141 is disposed between the first bump 1151 and the second bump 1152. In a partial region of the second ohmic contact 130 which, is on the same vertical line with the non-contact region 1141, the first region 131 having a non-linear impedance characteristic is disposed. The first region 131 may be disposed in a region adjacent to the first semiconductor layer 122 on the second ohmic contact 130. In FIG. 17, a side surface of each of the first electrode 152, the second electrode 154, the first bump 1151, the second bump 1152, and the first region 131 is shown with a vertical surface, but it is not necessarily limited thereto.

Figure 18:
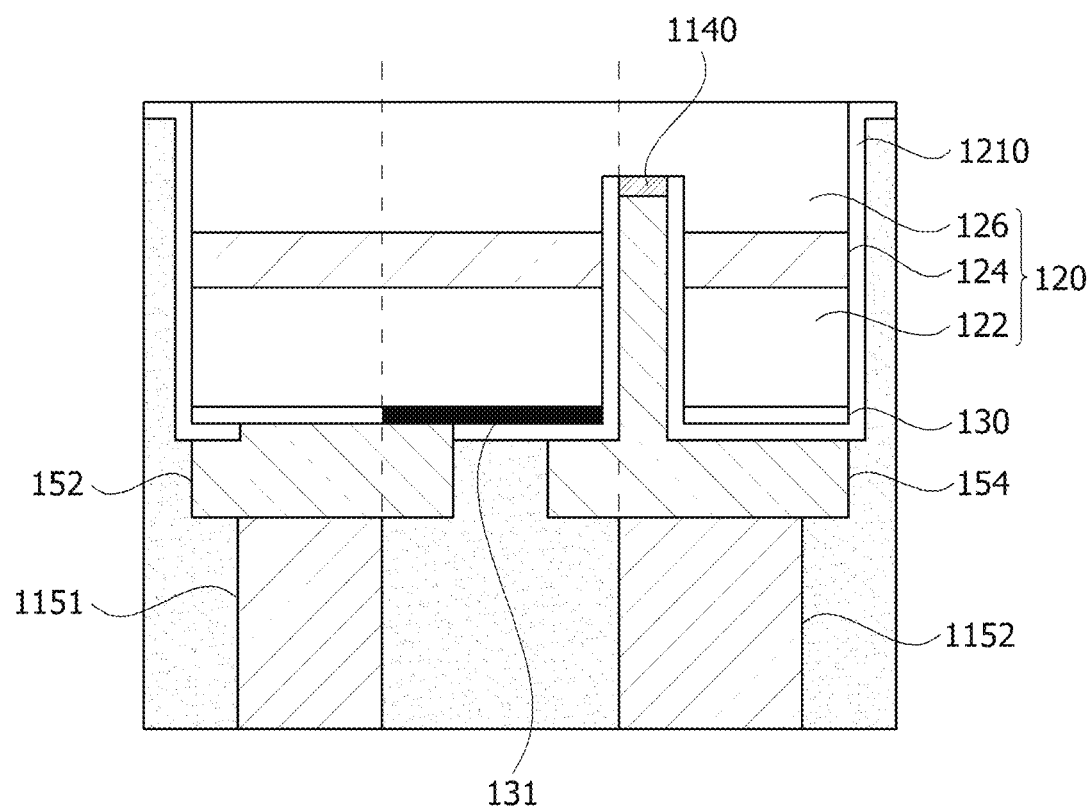
FIG. 18 is a cross-sectional view illustrating a light emitting device according to yet another embodiment of the present invention.

FIG. 18 is a cross-sectional view illustrating a light emitting device according to yet another embodiment of the present invention. Referring to FIG. 18, the light emitting device according to yet another embodiment of the present invention may include a substrate 110, a light emitting structure 120, a first electrode 152, a second electrode 154, a first bump 1151, and a second bump 1152. In the embodiment, descriptions overlapping with FIGS. 14 and 15 will be omitted.

In FIG. 18, the first bump 1151 and the second bump 1152 may be mutually separated by a predetermined distance and respectively disposed on the first electrode 152 and the second electrode 154. The lengths of the first bump 1151 and the second bump 1152 is formed to be smaller than the lengths of the first electrode 152 and the second electrode 154, and the non-contact region 1141 is disposed between the first bump 1151 and the second bump 1152. In the second ohmic contact 130 which is on the same vertical line with the non-contact region 1141, the first region 131 having a non-linear impedance characteristic is disposed. The first region 131 may be disposed in an entire region of the second ohmic contact 130 on the same vertical line with the non-contact region 1141. In FIG. 18, a side surface of each of the first electrode 152, the second electrode 154, the first bump 1151, the second bump 1152, and the first region 131 is shown with a vertical surface, but it is not necessarily limited thereto.

Figure 19:
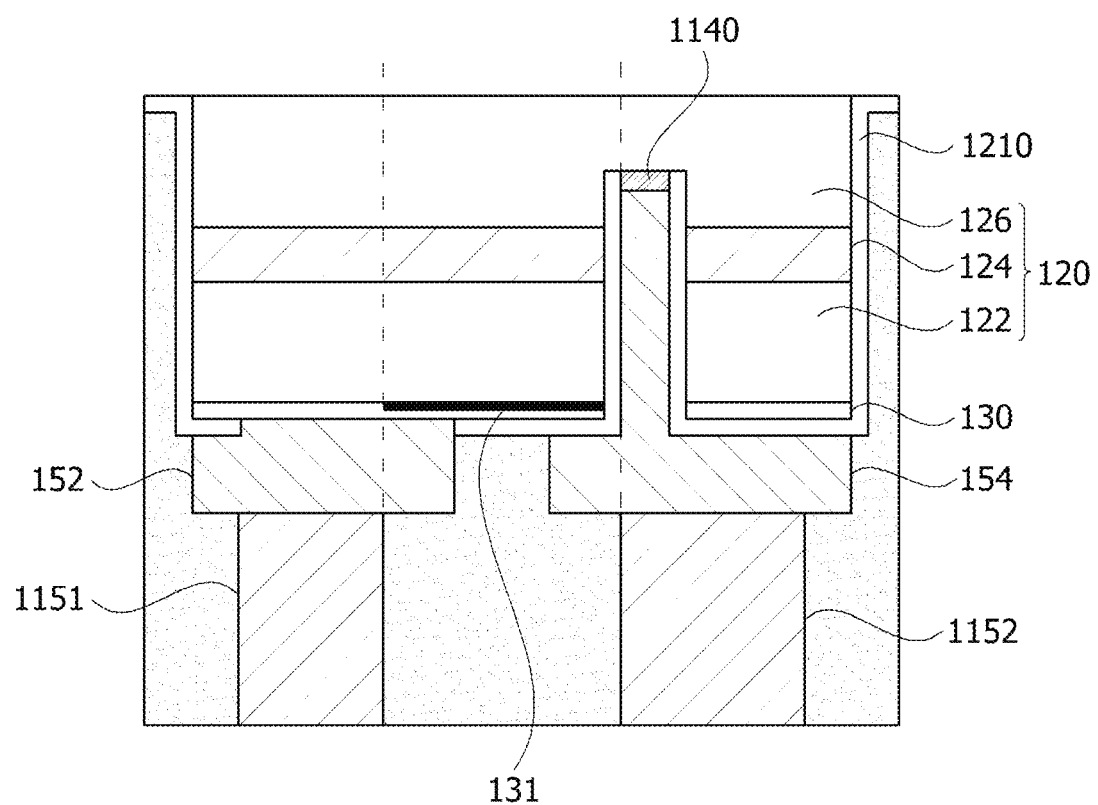
FIG. 19 is a cross-sectional view illustrating a light emitting device according to yet another embodiment of the present invention.

FIG. 19 is a cross-sectional view illustrating a light emitting device according to yet another embodiment of the present invention. Referring to FIG. 19, the light emitting device according to yet another embodiment of the present invention may include a substrate 110, a light emitting structure 120, a first electrode 152, a second electrode 154, a first bump 1151, and a second bump 1152. In the embodiment, descriptions overlapping with FIGS. 14 and 15 will be omitted.

In FIG. 19, the first bump 1151 and the second bump 1152 may be mutually separated by a predetermined distance and respectively disposed on the first electrode 152 and the second electrode 154. The lengths of the first bump 1151 and the second bump 1152 is formed to be smaller than the lengths of the first electrode 152 and the second electrode 154, and the non-contact region 1141 is disposed between the first bump 1151 and the second bump 1152. In a partial region of the second ohmic contact 130 which is on the same vertical line with the non-contact region 1141, the first region 131 having a non-linear impedance characteristic is disposed. The first region 131 may be disposed in a region adjacent to the first semiconductor layer 122 on the second ohmic contact 130. In FIG. 19, a side surface of each of the first electrode 152, the second electrode 154, the first bump 1151, the second bump 1152, and the first region 131 is shown with a vertical surface, but it is not necessarily limited thereto.

Figure 20:
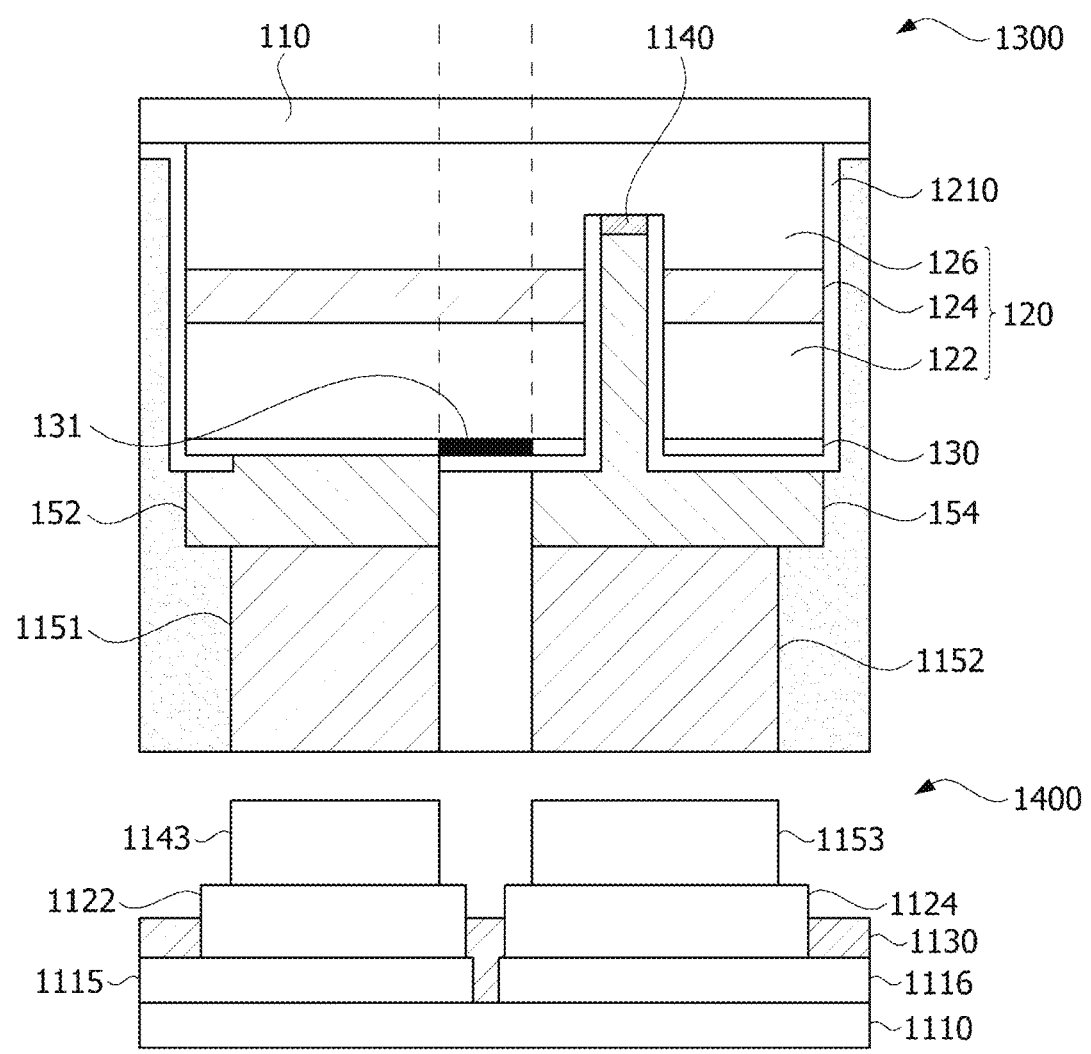
FIG. 20 is a cross-sectional view illustrating a light emitting device package according to an embodiment of the present invention.

FIG. 20 is a cross-sectional view illustrating a light emitting device package according to an embodiment of the present invention. Referring to FIG. 20, the light emitting device package according to the embodiment of the present invention may include a sub-mount 1400 and a light emitting device 1300. In the embodiment, descriptions overlapping with FIGS. 1 to 19 will be omitted.

The sub-mount 1400 may include a body 1110, a first metal layer 1115, a second metal layer 1116, a reflective layer 1130, a third electrode 1122, and a fourth electrode 1124.

The sub-mount 1400 may be disposed under the first bump 1151 and the second bump 1152. The body 1110 of the sub-mount 1400 may include a resin such as a polyphthalamide (PPA), a liquid crystal polymer (LCP), a polyamide9T (PA9T), etc., a metal, photosensitive glass, a sapphire, a ceramic, a printed circuit board, etc. However, the body 1110 of the sub-mount 1400 according to the embodiment is not limited to the above materials.

The first metal layer 1115 and the second metal layer 1116 may be separated from each other, and disposed on a top surface of the body 1110. Here, the top surface of the body 1110 may be a surface opposite the light emitting device 1300.

The first metal layer 1115 and the first bump 1151 may be aligned with each other in a vertical direction, and the second metal layer 1116 and the second bump 1152 may be aligned with each other in a vertical direction. Here, the vertical direction may be a direction from the body 1110 to the light emitting device 1300.

The first metal layer 1115 and the second metal layer 1116 may include a conductive metal such as aluminum (Al) or rhodium (Rh).

The reflective layer 1130 covers a top surface of each of the first metal layer 1115, the second metal layer 1116, and the body 1110. The reflective layer 1130 reflects light incident from the light emitting device 1300.

The reflective layer 1130 covers a top surface and a side surface of each of the first metal layer 1115 and the second metal layer 1116, and a portion of the body 1110 between the first metal layer 1115 and the second metal layer 1116.

The reflective layer 1130 may be a distributed Bragg reflective layer having a multilayered structure in which at least two different layers are alternately stacked one or more times, and reflects light incident from the light emitting device 1300. That is, the reflective layer 1130 may have a structure in which a first layer having a relatively high refractive index and a second layer having a relatively low refractive index are alternately stacked.

The first layer may include a first dielectric layer having $TiO_2$ and a second dielectric layer having $SiO_2$. For example, the reflective layer 1130 may include a structure in which $TiO_2/SiO_2$ layers are stacked one or more times. Further, the distributed Bragg reflective layer may prevent the oxidation of the first metal layer 1115 and the second metal layer 1116. Further, a thickness of each of the first layer and the second layer may be $\lambda/4$, where $\lambda$ denotes a wavelength of light generated by the light emitting device.

The third electrode 1122 may pass through the reflective layer 1130 and come in contact with the first metal layer 1115, and the fourth electrode 1124 may pass through the reflective layer 1130 and come in contact with the second metal layer 1116.

The third electrode 1122 may be disposed on the first metal layer 1115 and a bottom surface of the third electrode 1122 may be in contact with the first metal layer 1115, and a top surface of the third electrode 1122 may be exposed from the reflective layer 1130.

The fourth electrode 1124 may be disposed on the second metal layer 1116 and a bottom surface of the fourth electrode 1124 may be in contact with the second metal layer 1116, and a top surface of the fourth electrode 1124 may be exposed from the reflective layer 1130.

The bumps 1151 and 1152 of the light emitting device 1300 may be connected to bonding layers 1143 and 1153 and mounted on the sub-mount 1400 using various methods such as a wire-bonding, an eutectic bonding, etc.

Figure 21:
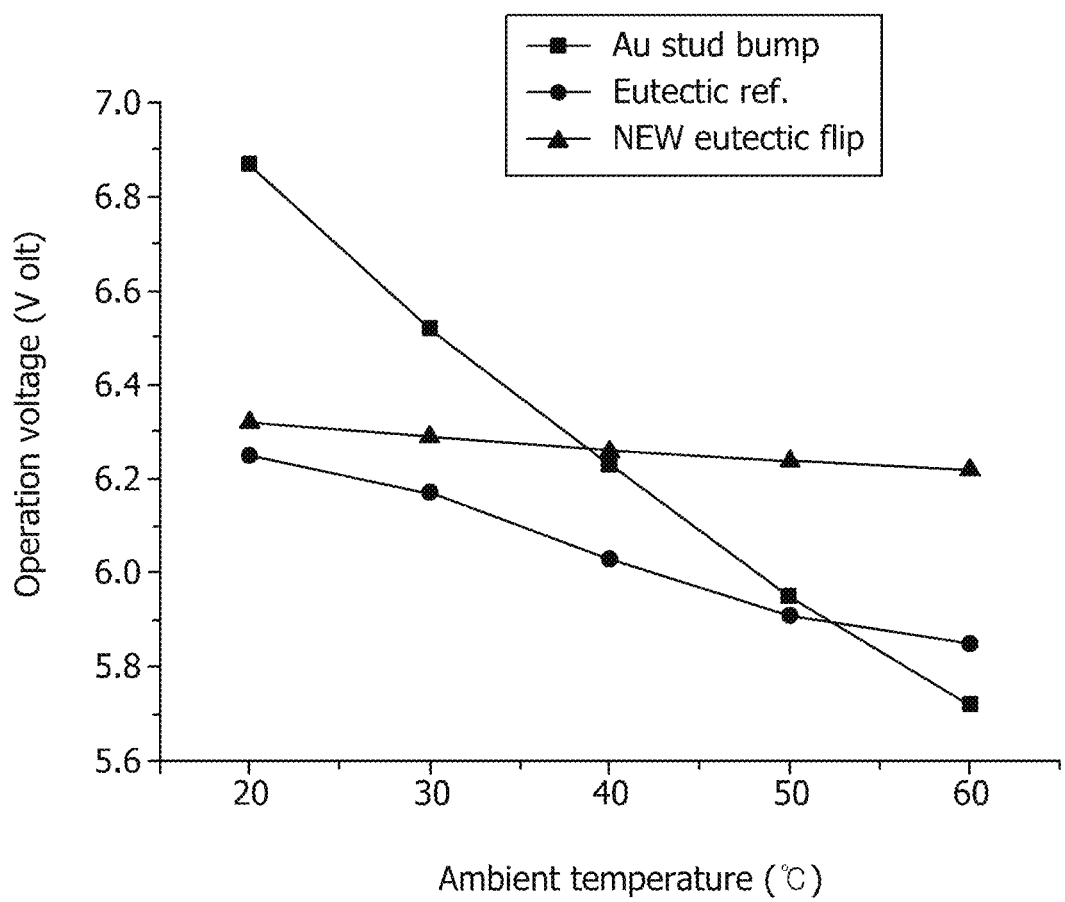
FIG. 21 is a graph illustrating an operating voltage property of a light emitting device package according to an embodiment of the present invention.

FIG. 21 is a graph illustrating an operating voltage property of a light emitting device package according to an embodiment of the present invention. In FIG. 21, a line with square marks denotes an operating voltage property of a light emitting device package which uses a wire-stud-bump method, a line with circle marks denotes an operating voltage property of a light emitting device package which uses a eutectic bonding method, and a line with triangle marks denotes an operating voltage property of a light emitting device package according to the embodiment of the present invention. Referring to the graph, it can be seen that, in the case of the wire-stud-bump method, a contact area between a sub-mount and a bump is small compared to the eutectic bonding method, and therefore heat emission efficiency is low and the operating voltage abruptly decreases due to an ambient temperature.

In the light emitting device package according to the embodiment of the present invention, it can be seen that an initial operating voltage property becomes somewhat large compared to the eutectic bonding method, but is hardly affected by an ambient temperature. This effect appears because a non-contact region corresponding to a main heat generation portion is replaced by a region having a non-linear impedance characteristic when the light emitting device operates, and the non-contact region does not contribute to light emission, and a heat generation problem is resolved.

FIGS. 22A to 22F are diagrams for describing a method of fabricating a light emitting device according to an embodiment of the present invention.

Figure 22A:
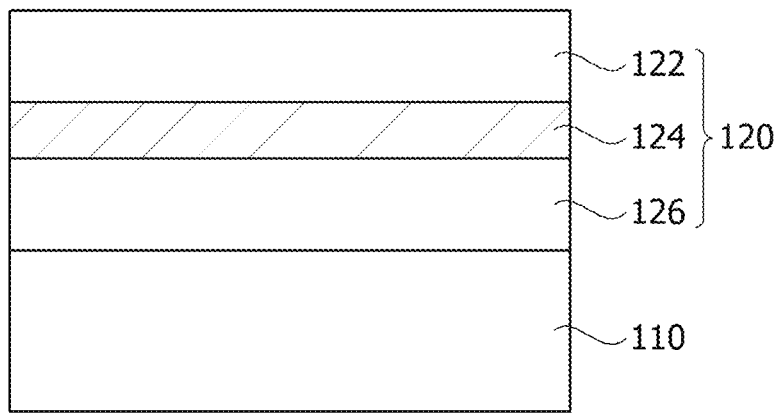
FIGS. 22A to 22F are diagrams for describing a method of fabricating a light emitting device according to an embodiment of the present invention.

First, referring to FIG. 22A, the light emitting structure 120 is formed on the substrate 110. In the light emitting structure 120, the second semiconductor layer 126, the active layer 124, and the first semiconductor layer 122 are sequentially formed.

Here, the substrate 110 may be formed with at least one of SiC, GaAs, GaN, ZnO, Si, GaP, InP, and Ge, but it is not necessarily limited thereto. When the substrate 110 does not incur a warpage of a nitride semiconductor, the substrate 110 may have a mechanical strength so that it is easily divided into discrete chips through a scribing process and a breaking process.

Figure 22B:
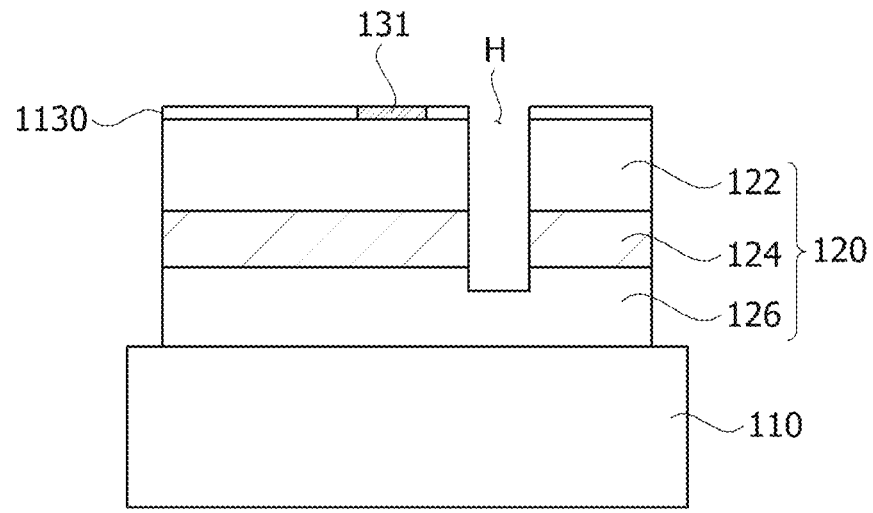

Then, as shown in FIG. 22B, the first region 131 is disposed on the second ohmic contact 1130. The first region 131 may be overlaid on the second ohmic contact 1130 or may be disposed before the second ohmic contact 1130 is formed.

Figure 22C:
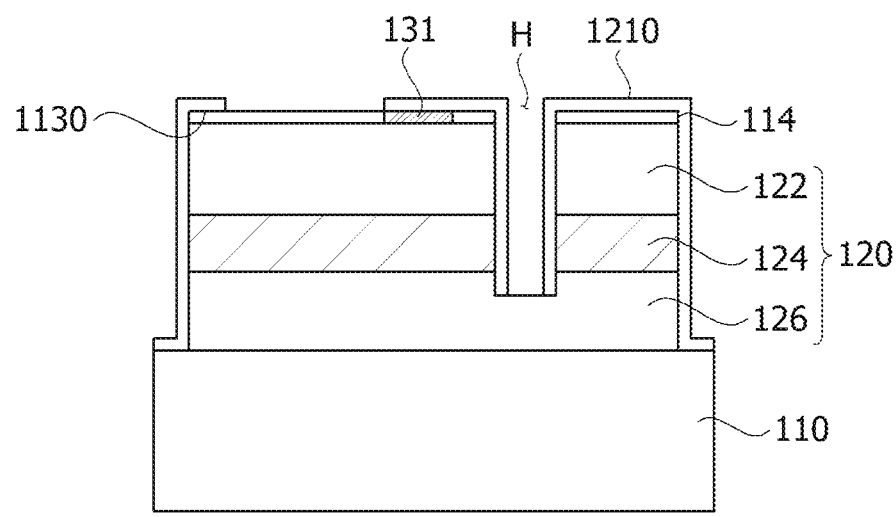

Then, as shown in FIG. 22C, the contact hole H is formed in the light emitting structure 120, the interlayer 1210 is formed on an outer surface of the light emitting structure 120. The inside of the contact hole H is insulated from the first semiconductor layer 122 and the active layer 124 by the interlayer 1210.

Figure 22D:
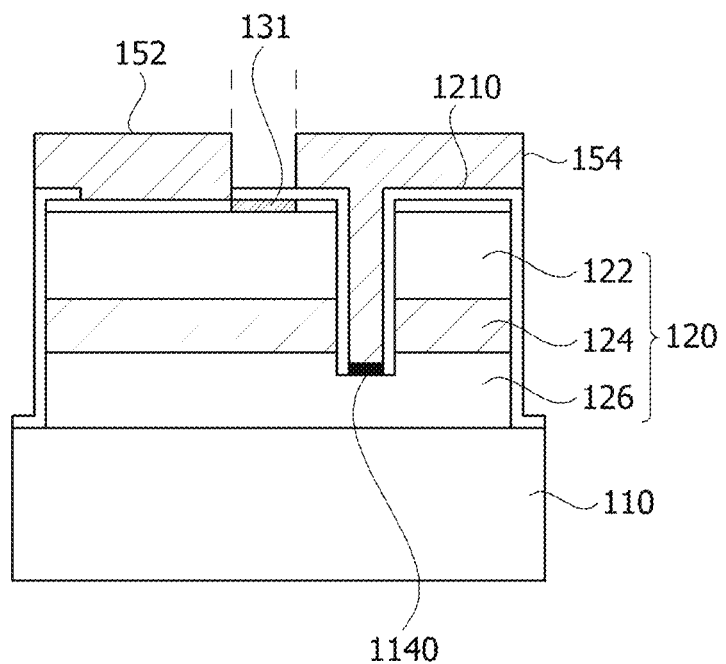

Then, as shown in FIG. 22D, the first electrode 152 connected to the first semiconductor layer 122 and the second electrode 154 connected to the second semiconductor layer 126 are formed. At this point, the first ohmic contact 1140 is formed between the second electrode 154 and the second semiconductor layer 126.

One surface of the first ohmic contact 1140 may be electrically connected to the second electrode 154, and the other surface may be electrically connected to the second semiconductor layer 126. A side surface of the first ohmic contact 1140 may be surrounded by the interlayer 1210.

Figure 22E:
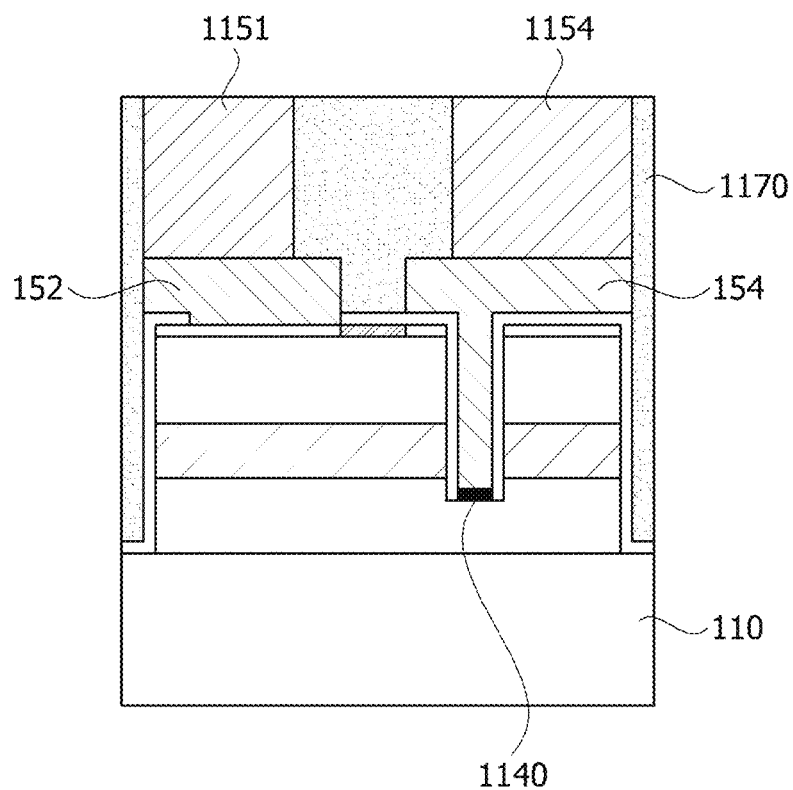

Then, as shown in FIG. 22E, the first bump 1151 formed on the first electrode 152 and the second bump 1152 formed on the second electrode 154 are formed. The first bump 1151 and the bump 1152 may include the same material as the first electrode 152.

Then, one surface of the light emitting device at which the first bump 1151 and the second bump 1152 are formed is filled with the support layer 1170, and then cured. At least a portion of the support layer 1170 may be formed between the first bump 1151 and the second bump 1152, on side surfaces of the first electrode 152 and the second electrode 154, and on a side surface of the light emitting structure 120.

Figure 22F:
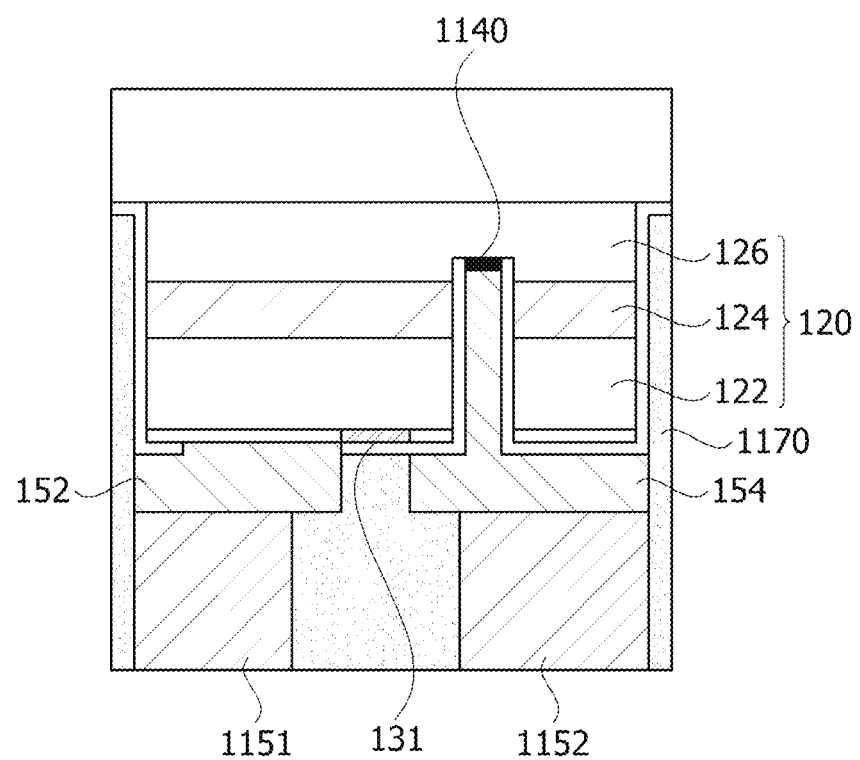

Then, as shown in FIG. 22F, the substrate 110 is removed, and an optical layer (not shown) may be formed on at least a part of the light emitting structure 120, the first electrode 152, the second electrode 154, the first bump 1151, and the second bump 1152 to fabricate a light emitting device package. The optical layer may include a wavelength converter. The substrate 110 may be detached by projecting a laser beam having a predetermined wavelength. The substrate 110 may be detached by a laser-lift-off method (LLO), but it is not necessarily limited thereto.

In the drawings, although only one light emitting device is shown, a wafer-level package in which a plurality of light emitting devices are continuously formed on one substrate, and then divided into a plurality of light emitting devices may be fabricated.

The plurality of light emitting devices according to the embodiment of the present invention may be arrayed on a substrate, and a light guide plate, which is an optical member, a prism sheet, a diffusion sheet, etc. may be disposed on a light path of the light emitting device package. The light emitting device package, the substrate, and the optical member may function as a backlight unit.

Further, a display device, an indicating device, an illumination system including the light emitting device package may be implemented.

Here, the display device may include a bottom cover, a reflective plate disposed on the bottom cover, a light emitting module for emitting light, a light guide plate disposed in front of the reflective plate and for guiding light emitted forward from the light emitting module, an optical sheet including prism sheets disposed in front of the light guide plate, a display panel disposed in front of the optical sheet, an image signal output circuit connected to the display panel and for providing image signals to the display panel, and a color filter disposed in front of the display panel. The bottom cover, the reflective plate, the light emitting module, a light guide plate, and an optical sheet may constitute the backlight unit.

Further, the illumination system may include a light source module including a substrate and a light emitting device package according to embodiments, a heat discharging unit which radiates heat of the light source module, and a power supply unit which processes or converts an electrical signal provided from the outside for provision to the light source module. For example, the illumination system may include a lamp, a headlight, or a streetlight, etc.

The headlight may include a light emitting module including light emitting device packages disposed on the substrate, a reflector for reflecting light emitted from the light emitting module in a specific direction, for example, frontward, a lens for refracting frontward light reflected by the reflector, and a shade which blocks or reflects a portion of the light reflected by the reflector and accomplishes a light distribution pattern that a designer wants.

According to embodiments, a surface property and an electrical property of a light emitting device can be enhanced.

Further, according to embodiments, an electrical property cannot be degraded even when a heat treatment at high temperature is performed.

Further, according to embodiments, an operating voltage property and a device operation property can be enhanced by solving a problem of heat generation.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A light emitting device comprising:
a light emitting structure including a first semiconductor layer, an active layer, and a second semiconductor layer;
a first electrode disposed on one side of the light emitting structure and electrically connected to the first semiconductor layer;
a second electrode disposed on one side of the light emitting structure and electrically connected to the second semiconductor layer; and
an ohmic contact including a first layer disposed between the second electrode and the second semiconductor layer and having aluminum (Al), a second layer having at least one $M_xAl_y$ alloy formed by a reaction with Al included in the first layer, and a third layer disposed on the second layer and having gold (Au).

2. The light emitting device of claim 1, wherein M has a melting point higher than that of Al.

3. The light emitting device of claim 1, wherein M includes one metal selected from copper (Cu), palladium (Pd), and silver (Ag).

4. The light emitting device of claim 1, wherein the $M_xAl_y$ alloy includes a $Cu_xAl_y$ alloy ($1 \leq x \leq 9$, $1 \leq y \leq 4$).

5. The light emitting device of claim 4, wherein, in the $Cu_xAl_y$ alloy, y is a value equal to or greater than x.

6. The light emitting device of claim 4, wherein the $Cu_xAl_y$ alloy has an electrical resistance of 20 Ω or less.

7. The light emitting device of claim 4, wherein the second layer includes at least one alloy selected from CuAl, $CuAl_2$, $Cu_4Al_3$, $Cu_3Al_2$, and $Cu_9Al_4$.

8. The light emitting device of claim 1, wherein an electrical conductivity of the $M_xAl_y$ alloy is greater than that of an Al-Au alloy.

9. The light emitting device of claim 1, further comprising an interlayer disposed on the second layer and configured to prevent an oxidation phenomenon of the second layer.

10. The light emitting device of claim 9, wherein the interlayer includes at least one metal or alloy selected from chromium (Cr), nickel (Ni), titanium (Ti), and gold (Au).

11. A light emitting device comprising:
a light emitting structure including a first semiconductor layer, an active layer, and a second semiconductor layer;
a first electrode disposed on one side of the light emitting structure and electrically connected to the first semiconductor layer;
a second electrode disposed on one side of the light emitting structure and electrically connected to the second semiconductor layer; and
a first ohmic contact including a first layer disposed between the second electrode and the second semiconductor layer and having aluminum (Al), a second layer including at least one $M_xAl_y$ alloy formed by a reaction with Al included in the first layer, and a third layer disposed on the second layer and having gold (Au),
wherein, in the light emitting structure, a first region having a nonlinear impedance (non-ohmic) property is disposed on a non-contact region not in contact with a sub-mount through the first electrode.

12. The light emitting device of claim 11, wherein a first bump and a second bump are spaced apart by a predetermined distance and respectively disposed on the first electrode and the second electrode to come in contact with an electrode of the sub-mount.

13. The light emitting device of claim 12, wherein the non-contact region includes a separate region between the first bump and the second bump.

14. The light emitting device of claim 13, wherein the first region is disposed on the same vertical line with the non-contact region.

15. The light emitting device of claim 14, wherein a length of the first region is equal to or smaller than that of the non-contact region.

16. The light emitting device of claim 12, wherein an interlayer is disposed on the first electrode and the second electrode, and the first bump and the second bump are respectively in contact with the first electrode and the second electrode through an open portion of the interlayer.

17. The light emitting device of claim 12, wherein the light emitting structure includes a second ohmic contact disposed on a contact surface with the first electrode, and the first region is disposed at the second ohmic contact.

18. The light emitting device of claim 17, wherein the first region is disposed at the second ohmic contact of a P-type semiconductor layer.

19. The light emitting device of claim 11, wherein the first region includes at least one of an oxide, a nitride, and a metal.

20. A light emitting device package comprising the light emitting device according to claim 1 and a sub-mount.

* * * * *